(12) United States Patent
Dunnihoo

(10) Patent No.: US 9,297,852 B2
(45) Date of Patent: Mar. 29, 2016

(54) EMBEDDED TRANSIENT SCANNING SYSTEM APPARATUS AND METHODOLOGY

(71) Applicant: Jeffrey C. Dunnihoo, Bertram, TX (US)

(72) Inventor: Jeffrey C. Dunnihoo, Bertram, TX (US)

(73) Assignee: PRAGMA DESIGN, INC., Betram, TX (US)

( * ) Notice: Subject to any disclaimer, the term of this patent is extended or adjusted under 35 U.S.C. 154(b) by 674 days.

(21) Appl. No.: 13/664,563

(22) Filed: Oct. 31, 2012

(65) Prior Publication Data

US 2013/0132007 A1 May 23, 2013

Related U.S. Application Data

(60) Provisional application No. 61/557,172, filed on Nov. 8, 2011.

(51) Int. Cl.

| G01R 31/26 | (2014.01) |
| G06F 17/40 | (2006.01) |
| G06F 19/00 | (2011.01) |
| G01R 31/28 | (2006.01) |
| G01R 31/00 | (2006.01) |
| G01R 31/3181 | (2006.01) |

(52) U.S. Cl.
CPC .......... *G01R 31/2879* (2013.01); *G01R 31/002* (2013.01); *G01R 31/26* (2013.01); *G01R 31/2884* (2013.01); *G01R 31/31816* (2013.01); *G06F 17/40* (2013.01); *G06F 19/00* (2013.01)

(58) Field of Classification Search
None
See application file for complete search history.

(56) References Cited

U.S. PATENT DOCUMENTS

| 3,082,374 A * | 3/1963 | Buuck ................... F41G 7/005 324/73.1 |
| 5,999,465 A | 12/1999 | Shabde et al. |
| 6,037,796 A * | 3/2000 | Graef ................. G01R 31/3004 324/762.01 |
| 6,255,843 B1 * | 7/2001 | Kurihara .......... G01R 31/31907 324/762.02 |
| 6,593,765 B1 * | 7/2003 | Ishida .............. G01R 31/31917 324/762.03 |
| 6,784,684 B2 * | 8/2004 | Tanimura ......... G01R 31/31924 324/73.1 |
| 6,954,083 B1 | 10/2005 | Thornley et al. |

(Continued)

FOREIGN PATENT DOCUMENTS

| JP | 58-123472 A * | 7/1983 |
| WO | 2010076687 | 7/2010 |

OTHER PUBLICATIONS

Jack N. et al.: "Voltage monitor circuit for ESD diagnosis", Electrical Oversterss/Electrostatic Discharge Symposium (EOS/ESD), Sep. 11, 2011, pp. 1-9, XP032242391.

(Continued)

*Primary Examiner* — Edward Cosimano
(74) *Attorney, Agent, or Firm* — Harness, Dickey & Pierce, P.L.C.

(57) ABSTRACT

Systems and methods for scanning and characterizing an integrated circuit for transient events. Embedded apparatus can detect transient events that may be incident on the integrated circuit, and moreover, identify particular nodes of the integrated circuit that are affected by the transient event. Additionally, the integrated circuit can be characterized by applying known transient pulses of varying severity to selected nodes of the integrated circuit, detecting the severity levels at which the selected nodes can fail, and storing indications pertaining to pulse severity at which selected nodes can fail. Moreover, based on the characterization, targeted protection mechanisms can be provided for nodes that are characterized as being susceptible.

31 Claims, 13 Drawing Sheets

(56) References Cited

U.S. PATENT DOCUMENTS

| | | | |
|---|---|---|---|
| 7,823,128 B2* | 10/2010 | Bundy | G06F 11/263 |
| | | | 717/124 |
| 8,116,049 B2 | 2/2012 | Ker et al. | |
| 8,254,071 B2 | 8/2012 | Dunnihoo et al. | |
| 8,351,170 B2 | 1/2013 | Dunnihoo et al. | |
| 8,755,158 B2 | 6/2014 | Duvvury et al. | |
| 2003/0057940 A1* | 3/2003 | Tanimura | G01R 31/31924 |
| | | | 324/756.07 |
| 2005/0235263 A1* | 10/2005 | Bundy | G06F 11/263 |
| | | | 717/124 |
| 2009/0015974 A1 | 1/2009 | Wang et al. | |
| 2010/0256937 A1 | 10/2010 | McKay et al. | |

OTHER PUBLICATIONS

Gerdemann A. et al.: "A novel testing approach for full-chip CDM characterization", 29th Electrical Overstress/Electrostatic Discharge Symposium (EOS/ESD), Sep. 11, 2007, pp. 5A.3-1, XP031189831.

International Search Report and Written Opinion of the International Searching Authority—PCT/US2012/063946—ISA/EPO—May 24, 2013 (PRA_PCT).

PCT International Preliminary Report for PCT Application No. PCT/US2012/063946 (published as WO 2013/070768) dated May 13, 2014 which claims priority to the instant application; 9 pages.

Ming-Dou Ker, Transient-to-Digital Converter for ESD Protection Design in Microelectronic Systems, IEEE Asian Solid-State Circuits Conference, Nov. 3-5, 2008, pp. 409-412, Fukuoka, Japan.

Nathan Jack and Elyse Rosenbaum, Voltage Monitor Circuit for ESD Diagnosis, EOS/ESD Symposium, 11-369, pp. 7A.1-1 to 7A.1-9.

White Paper 3, System Level ESD, Part II: Implementation of Effective ESD Robust Designs, Industry Council on ESD Target Levels (http://esdindustrycouncil.com/), Aug. 2012, Revision 0.6.

"A high performance peak detector sample and hold circuit for detecting power supply noise"; Hwang-Cherng Chow; Zhi-Hau Hor; Circuits and Systems, 2008, APCCAS 2008, IEEE Asia Pacific Conference; Nov. 30, 2008—Dec. 3, 2008; Abstract only; 1 pg.

"On-chip Real-Time Power Supply Noise Detector"; Sehgal, A; Song, P; Jenkins, K.A.; Solid-State Circuits Conference, 2006; ESSCIRC 2006; Sep. 2006; Abstract only; 1 pg.

"On Design of Low Cost Power Supply Noise Detection Sensor for Microprocessors"; Vijayakumar, A; Kumar, R.; Kundu, S.; VLSI (ISVLSI), 2012 IEEE Computer Society Annual Symposium; Aug. 2012; Abstract only; 1 pg.

"New 4-Bit Transient-to-Digital Converter for System-Level ESD Protection in Display Panels"; Ming-Dou Ker; Cheng-Cheng Yen; Industrial Electronics, IEEE Transactions; Feb. 2012; Abstract only; 1 pg.

"Transient detection circuit for system-level ESD protection and its on-board behavior with EMI/EMC filters"; Ming-Dou Ker; Chi-Sheng Liao; Cheng-Cheng Yen; Electromagnetic Compatibility, 2008, EMC 2008, IEEE International Symposium; Aug. 2008; Abstract only; 1 pg.

"Transient-to-Digital Converter for System-Level Electrostatic Discharge Protection in SMOS ICs"; Mimg-Dou Ker; Cheng-Cheng Yen; Electromagnetic Compatibility; IEEE Transactions; Aug. 2009; Abstract only; 1 pg.

"On-chip di/dt detector circuit for power supply line"; Nakura, T; Ikeda, M; Asada, K.; Microelectronic Test Structures, 2004 Proceedings; ICMTS "04; The International Conference; Mar. 2004; Abstract only; 1 pg.

"Latchup current self-stop circuit for whole-chip lathcup prevention in bulk CMOS integrated circuits"; Jeng-Jie Peng; Ming-Dou Ker; Hsin-Chin Jiang; Circuits and Systems, 2002; ISCAS 2002; IEEE International Symposium, 2002; Abstract only; 1 pg.

\* cited by examiner

EMBEDDED TRANSIENT SCANNING SYSTEM APPARATUS AND METHODOLOGY

CLAIM OF PRIORITY UNDER 35 U.S.C. §119

The present Application for Patent claims priority to Provisional Application No. 61/557,172 entitled "EMBEDDED TRANSIENT SCANNING SYSTEM APPARATUS AND METHODOLOGY" filed Nov. 8, 2011, and assigned to the assignee hereof and hereby expressly incorporated by reference herein.

FIELD OF DISCLOSURE

Disclosed embodiments are directed to systems and methods for embedded transient detection and characterization. More particularly, some exemplary embodiments are directed to systems and methods for detecting transient events in integrated circuits, identifying particular nodes of the integrated circuit which are affected by the transient events, and characterizing the integrated circuit based on transient events.

BACKGROUND

Applications and uses for high performance electronic devices and systems have extended into almost every aspect of modern life. This wider usage exposes electronic systems to ever more harsh thermal, environmental and electromagnetic conditions. Meanwhile, the same advances in semiconductor miniaturization and system packaging advances which makes these performance and capability increases possible, also tend to suffer higher sensitivities to damage and functional upset, especially due to unavoidable electromagnetic transients. Integrated circuits (ICs) within these systems are susceptible to damaging and disrupting electrostatic discharge (ESD) pulses, lightning surges, other electrical fast transients, and/or effects of single event upsets (SEUs) in the operating environment. System designers must carefully balance cost constraints and performance demands with minimum robustness requirements in their products. Consideration must be given not only to the end user environment, but also to the development and manufacturing phases of production.

Currently there are a number of solutions for characterizing and qualifying system and component transient robustness, fewer methods for monitoring manufacturing and assembly processes, and extremely limited options for transient induced field failure identification and analysis.

Industry expert groups have carefully characterized various aggressor transients and defined standards and specifications of transient pulse simulator systems for repeatable product characterization and qualification. Various system product industries (consumer, computer, automotive, etc.) tend to select appropriate levels of these defined pulse characteristics, test methods, and failure criteria as a minimum qualification level for that product class. These well-defined and universally accepted testing standards primarily address this qualification aspect of the final system as a unit, with little, if any, information extractable from the results regarding individual subsystem components and failure mechanisms, and provide almost no insight into the statistical margins between pass and fail.

Some attempts have been made to adapt these system level tests in order to isolate and instrument device nodes for analysis, but these solutions fail to meet the needs of the industry because the probing techniques are either invasive (i.e. the system must be disassembled, thus breaking the system integrity and exposing it to unrelated induced electromagnetic fields from pulse simulators) or they do not directly correlate back to the final qualification test pass/fail criteria (for example, common device leakage current tests and software upsets or failures do not necessarily correlate). Other solutions attempt to focus strictly on hard failures (i.e. permanent destructive circuit damage) but these solutions are similarly unable to meet the needs of the industry because hard failures are only one aspect of system robustness. Soft failures (e.g. software upsets and recoverable system resets) are increasing in prevalence, along with smaller semiconductor process technology, lower process voltages, and faster circuitry.

Still other solutions seek to adapt electromagnetic interference (EMI)/electromagnetic compatibility (EMC) three-dimensional scanning systems in conjunction with injected pulse generator simulators in current reconstruction and transient susceptibility systems. These systems attempt to infer the transient currents into and out of device pins or nodes in the system from the measured electromagnetic H-fields and E-fields, or to actively inject them for observation. These systems attempt to provide a detailed estimate of which local device is affected by the transient pulse effects and how each device is affected by the residual transient pulse after being attenuated by protection devices. But these solutions also fail to meet industry needs, for example, because a 5 cm×5 cm printed circuit board (PCB) can take as much as 20 hours to scan and only for a single port I/O, they are inordinately expensive due to the precision scanning hardware required, and finally they can only be applied to a sub-assembly or planar PCB which must be accessed on one open side (not mounted in the system enclosure, nor in a daughterboard backplane configuration).

Many advances have meanwhile been made in the area of electrostatic discharge (ESD) process controls in the product manufacturing environment (ESD being one of the most common aggressor transient pulse issues confronting system designers). ESD event detectors and continuous real-time monitors on assembly lines can detect and alert personnel to dangerous (for the components) electromagnetic field levels due to poor grounding, handling, and packaging issues on the controlled manufacturing floor. Until these components are installed on the circuit boards and assembled into their complete enclosures, they are substantially more susceptible to transient induced damage. Sporadic failures on a system manufacturer's poorly controlled assembly line are often blamed on insufficiently robust devices from the component vendor. Standard operating procedure in this case is to physically remove the suspect component and return it to the component vendor (during which procedure, the components are often further damaged due to manual desoldering, handling, etc.). Then, the component vendor attempts to do a root-cause analysis, and often the microscopic evidence is inconclusive.

Routine data-collection of on-board event detection and analysis can provide a non-destructive, early indicator of manufacturing process health. This data can help identify the problem, as well as pinpoint the liability, long before removing and returning a part for expensive root cause analysis. However, existing techniques are unable to meet this need.

Another potential problem that can arise in the field is inter-block damage within chips due to internal transients on power rails during gate switching. At ultralow operating voltages, a glitch of even a few millivolts on the power rail aligned at the critical switching time of a CMOS gate can cause upset or even permanent damage.

Accordingly detecting such transients on internal nodes as well as input/output (I/O) nodes of integrated circuits of a system can be crucial to debugging the system. However, current technology does not address this need.

Additionally, typical end user environments usually have no data collection, site analysis, or even reliable or competent eye-witnesses for random ESD events and vectors. Thus, ESD electrical overstress (EOS) failures, in particular, are notoriously mischaracterized and erroneously assigned to incorrect causation, and rarely provide reliable feedback to engineering and development on robustness of the product in the field or the specific application environment requirements. Again, with lifetime product data collection through software accessible registers and interfaces, worldwide aggregate collection of ESD event statistics is possible for product reliability and for related scientific inquiries.

It would be desirable to have a device that detects and accurately characterizes transient pulses while the system is assembled in part or in whole, and that does not affect the normal operation or configuration of the system being analyzed. Furthermore, it would also be desirable to have a device that provides this detection and characterization function without the need for additional, costly, calibrated precision scanning and measurement equipment. Still further, it would be desirable to have a device for detection and characterization which can be accessed through existing, well known internal register space interfaces (such as peripheral component interconnect (PCI) configuration registers) and/or external test and debug interfaces, such as boundary scan.

Therefore, there currently exists a need in the industry for a device and associated method that that can provide the advantages of transient scanning and residual current measurement equipment, while the product is fully assembled and operating without present constraints of partial disassembly for access to PCBs and other components, all without adding appreciable additional product costs. Additionally, such a device would not only provide a method for improved and enhanced analysis and design methodologies, but since the detection and characterization device is integrated into the system, it would inherently enable methods of data collection outside of the development lab into the end user environment, for example, for reliability studies, warranty information, and field repair diagnostics.

SUMMARY

Exemplary embodiments advantageously fill the aforementioned deficiencies by providing an embedded transient scanning system and methodology which provides the advantages of state-of-the-art transient scanning and residual current measurement equipment in the design, development, manufacturing, and end user applications, whether a design under test (DUT) is fully or partially assembled, operating or quiescent, powered or unpowered, and all without adding appreciable additional product costs.

Accordingly, an exemplary embodiment is directed to a method of monitoring an integrated circuit for transient events, the method comprising: if a transient event is incident on the integrated circuit, detecting the transient event, and identifying one or more nodes of the integrated circuit that are affected by the transient event.

Another exemplary embodiment is directed to a method of characterizing an integrated circuit for transient events, the method comprising: applying a first transient pulse of a first severity to a node of the integrated circuit, detecting pass/fail conditions related to the node, and storing a first indication of the pass/fail conditions corresponding to the first transient pulse for the node.

Yet another exemplary embodiment is directed to an apparatus comprising: a first transient event analysis circuit configured to: monitor an integrated circuit for transient events, and if a transient event is incident on the integrated circuit, detect the transient event, and identify one or more nodes of the integrated circuit that are affected by the transient event.

A further exemplary embodiment is directed to a system comprising: means for detecting a transient event if the transient event is incident on an integrated circuit, and means for identifying one or more nodes of the integrated circuit that are affected by the transient event.

An exemplary embodiment is also directed to a non-transitory computer-readable storage medium comprising code, which, when executed by a processor, causes the processor to perform operations for monitoring an integrated circuit for transient events, the non-transitory computer-readable storage medium comprising: code for detecting a transient event if the transient event is incident on an integrated circuit; and code for identifying one or more nodes of the integrated circuit that are affected by the transient event.

Exemplary embodiments comprise a collection of additional embedded transient event detection and characterization circuit blocks, each of which are made up of the following components: one or more transient event detection circuits connected to distinct input/output pad cells or other nodes of an integrated circuit or system component, one or more detection registering circuit blocks to latch and hold event detection state, level, intensity, polarity and other event parameters of interest, a central plenary collection network for accessing the detection state information for individual nodes and/or input/output pads, and a monitoring utility, such as an on-board controller or externally linked PC for interactive reading, analyzing and resetting of the event status information. These components are related as follows: an applied aggressor transient pulse is detected by the one or more transient event detection circuits and the corresponding event detection state is characterized and latched by the one or more detection registering circuit blocks according to a desired plurality of levels, intensity, polarity, and other parameters up to and potentially including detection of permanent damage to the associated circuit elements. This event data is then polled through the central plenary collection network for iterative analysis or logging with a monitoring utility.

Exemplary embodiments may also include detection and characterization circuits for transient pulses associated with component level ESD (machine model (MM), charged device model (CDM), human body model (HBM), and/or human metal model (HMM)) system level ESD (international electrotechnical commission (IEC) standard 61000-4-2, cable discharge events, etc.) lightning/surge pulses (IEC61000-4-5), electrical fast transients (EFT/IEC61000-4-4), transmission line pulse (TLP), induced and conducted radio frequency (RF) fields, and/or voltage dips and dropouts (IEC61000-4-11). These detection and characterization circuits may be incorporated into every input/output integrated circuit pad cell, or only selected input/output cells with increased exposure to aggressor pulses, and/or they may be associated with other nodes of interest or protection mechanisms within an integrated circuit such as triggered VDD-VSS power protection clamps, or CDM detection modules. The detection registering circuit may comprise a simple volatile latch which loses state information when system power is removed, or it may utilize non-volatile storage methods to retain event information after system power is removed, or it may transmit event data to another system domain for capture of event information regardless of system power. The central plenary collection network may comprise a suitable version of a boundary scan chain such as a joint test access group (JTAG) IEEE 1149 scan chain of serial event detection bits, or alternate soft register, or configuration register, or another convenient existing serial or parallel bus such as PCIx, I.sup.2C, SPI, Ethernet or a higher level network abstraction such as the internet. For improved reliability and safety, such existing serial or parallel bus may be optically or otherwise electrically isolated, or even wirelessly connected, such as via BLUETOOTH™ wireless technology or a near field communication link.

Similarly, the method associated with exemplary embodiments may also include one or more of the following steps: for a design and development environment, iterative simulator pulses may be applied to the DUT and the resulting event detection data may be analyzed to compare and contrast various transient mitigation options, such as transient voltage suppressor (TVS) devices or shielding. Monitoring event detection data between successively increased intensity of aggressor pulses can provide a basis for characterization of TVS protection robustness margin and failure levels. For a factory production environment, on-board transient event detection devices may be used to monitor and record assembly and test environments, much as disposable g-shock indicators are utilized to monitor physical abuse applied during shipping. For the end user environment, an on-board system management micro-controller may poll event detection data and alert the user through a front panel indicator or other error message. Conversely, the plenary data-collection network system may provide a combinatorial interrupt logic output which can be used to interrupt the main system or watchdog CPU and initiate forced diagnostic code to interpret and act upon event detection data, automatically taking recovery actions, and avoiding further data corruption and system instability. Diagnostic software may be run retroactively to determine if a transient event may have potentially caused a temporary dysfunction or permanent malfunction of a system, in order to more quickly assess the actual state of the system in question for return, repair or recovery.

Exemplary embodiments can provide: an integrated component and pin-level transient detection and characterization function for the system in the design, debug and development phases; an integrated component and system level transient detection, characterization and logging system for manufacturing and assembly process monitoring; and/or an on-board lifetime capability to provide transient event characterization data from the system level product in the field for further design refinement and warranty/reliability tracking. The associated method can improve: design and development techniques by directly reporting and specifically identifying a pulse entry vector and severity due to the explicit currents and voltages induced into the chip by the actual aggressor pulse, rather than via inferred ideal assumptions of the designer or developer; provide system level identification of process health via statistical data collection of event severity and vectors over multiple instances of work-in-process; and/or provide an efficient field-reporting mechanism for transient events that would be impractical or cost-prohibitive to instrument in the field with existing methodologies.

Exemplary embodiments can also provide structural advantages over known devices or solutions. More specifically, exemplary embodiments can advantageously include the presence of: on-board, integrated transient event detection and characterization functionality without additional precision current or field probes, calibrated targets, high-bandwidth oscilloscopes and other test equipment; system-wide visibility within a fully assembled end product, (no direct PCB access is necessary); and/or negligible additional cost because the logic required for the detection and characterization circuits and detection registering circuits can be fabricated in the same process geometry as the target integrated circuit application, and is potentially orders of magnitude smaller than the relatively large physical TVS clamp structures already required to protect nodes being monitored.

Furthermore, the process associated with exemplary embodiments can also include additional advantageous aspects related to: ability to be inserted into existing standard test methods and qualification methods as a pass/fail criterion in and of itself; ability to provide valuable enhanced non-destructive qualification limits by providing alerts of approaching failure levels before actual damage occurs, for example, in the case of valuable prototypes.

Among other things, it is an object of exemplary embodiments to provide an embedded transient scanning system apparatus and methodology that does not suffer from any of the problems or deficiencies associated with prior solutions.

It is still further an object of exemplary embodiments to economically embed the analytical capabilities of scanning transient detection, test and measurement systems into the end product such that the capabilities are as portable as the end product itself.

Further still, it is an object of exemplary embodiments to improve the effective utility of known transient detection and robustness analysis methods by minimizing the time required to isolate and characterize strike data-collection, including making full automation of such analysis possible to the extent that it could even be included as part of manufacturing assembly, test and acceptance procedures.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Figure 1:
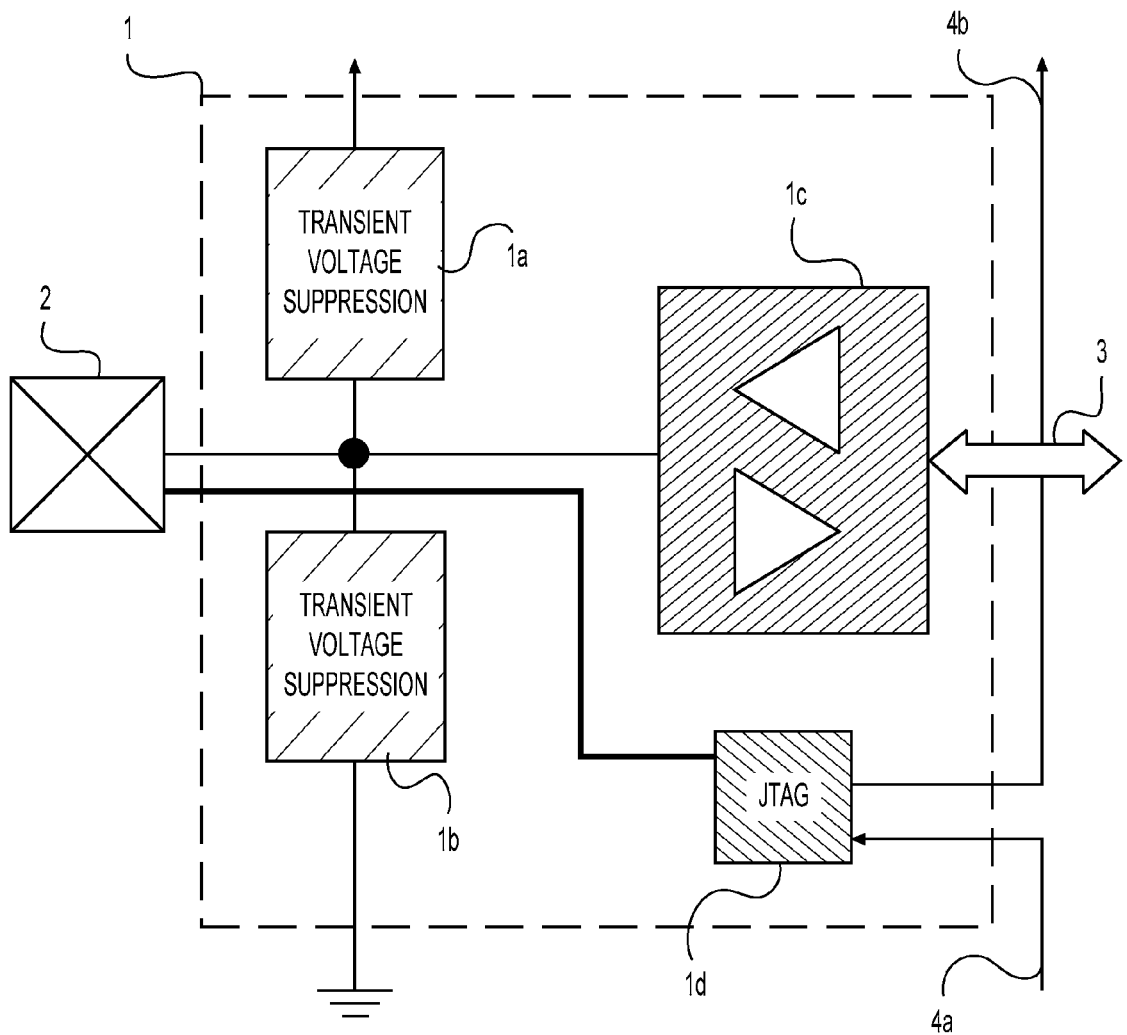
FIG. 1 shows a block diagram of a conventional integrated circuit I/O pad cell, with TVS clamps and conventional I/O buffer and JTAG test circuitry block feeding a boundary scan test chain.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. Furthermore, while certain embodiments may be described as embodied in an integrated circuit, embodiments are not limited to a single integrated circuit, but may pertain to a system with one or more integrated circuits. As such, exemplary embodiments may be embodied in a test chip or solutions such as a system on a chip (SoC). In addition, for each of the embodiments described herein, the corresponding form of any such embodiments may be described herein as, for example, "logic configured to" perform the described action.

Exemplary embodiments are directed to embedded transient scanning system apparatus and methodologies. Embodiments may include a device comprising the following components: a system comprising one or more printed circuit board assemblies, each comprising one or more circuit node traces interconnecting the input/output and power pins, pads, and balls of one or more integrated circuits, of which communicate status, control and testing information throughout the greater part of the system on standard interconnect buses, such as JTAG/Boundary Scan. Embodiments will be described generally with reference to "nodes" of these integrated circuits for which transient event detection and characterization may be provided, and such reference to nodes is illustrative but not limiting, and thus the scope of the embodiments may extend to internal nodes, logic elements, nets, hidden status registers, test registers, input/output nodes, power pins, pads, etc. While each of these integrated circuits can incorporate the desired transient event detection and characterization circuitry, along with a compatible data reporting network platform, the modular nature of the reporting network does not require that every component implement the detection and characterization functions. These components are related as follows: each integrated circuit is to be connected permanently or for the testing period desired such that the communication bus such as JTAG makes available the various event detection and characterization registers for analysis and inspection via central debug registers or ports (such as a JTAG debug port). It should further be noted that if powered, power supplies necessary to access the event and characterization registers may not necessarily co-reside in the domain which powers the event detection and characterization circuitry. In this case certain test and debug power supplies may be required during analysis, but not during event capture.

A method associated with an exemplary embodiment comprises: powering the DUT and verifying complete functional operation; connecting a test and debug interface port to a monitoring system for debug; applying power, as needed, to a corresponding test and debug port; reading and resetting appropriate transient event and characterization registers as needed; and removing applied power if required. A low-level, preferably non-damaging pulse is applied, with a desired transient simulator and appropriate system level transient test procedure that does not upset the system. The test and debug interface port is then coupled to a lab PC for debug, and once again power is applied, if needed, to the corresponding test and debug port. The method can further comprise reading and evaluating corresponding transient event and characterization registers as needed; and removing applied power if required. If no damage or dysfunction has been recorded, the transient simulator pulse level is increased to an appropriate level and the application of the transient stress is repeated. The steps of increasing the transient simulator pulse level, reading and evaluating corresponding transient event and characterization registers, and if no damage or dysfunction is recorded, further increasing the transient simulator pulse levels, are repeated until the limit of expected dysfunction or damage is observed. It will be understood that while in some embodiments, reference to "pulse levels," "stress levels," or the like, with regard to applied or incident transients, can relate to voltage levels, in other embodiments the reference to pulse levels can also relate to metrics such as voltage levels, duration of applied pulses, specified event parameters, rise times of pulses, energy levels, peak or average current levels, etc. Moreover, in some embodiments, it may be desirable to test endurance characteristics of nodes of the DUT to consecutive or repeated transient pulses, and therefore, in these embodiments, references to pulse levels can also indicate a number of consecutive/repeated pulses of either the same or varying levels of severity. Returning to the method steps, the complete analysis of system robustness can be gleaned from the data collected with regard to which system I/O pins received what stress levels due to the applied pulse, and at what external pulse levels they began to degrade and at which point(s) they began to fail. Repetition of this test for statistically meaningful samples can help determine extrapolated overall robustness and protection margins of a given system configuration. Alternative system (DUT) configurations (such as adding additional Transient Voltage Suppressors (TVS) or shielding) may demonstrate improved or degraded results, leading to concrete analysis decisions on system robustness development with respect to cost. It should further be noted that this analytical method can apply to the design and development phase of product development. Additionally, the same transient event detection circuitry may be used in a product manufacturing environment or a field application for event detection and proactive recovery, similar to, or in conjunction with S.M.A.R.T. (Self-Monitoring, Analysis and Reporting Technology) as used in hard disk drive controllers and servers.

Referring again to the figures, FIG. 1 shows a conventional external I/O circuit cell 1 connected to chip I/O connection pad 2. Input/output buffer circuit 1c communicates with internal core logic or circuitry of a DUT (not shown) via bus 3. For testability, boundary scan chain logic, JTAG 1d is included to transfer status and control signals along boundary scan chain input 4a and output 4b. In some configurations this may also include a multiplexer block to allow control of the I/O buffer, but is omitted from this figure for clarity. Clamps such as TVS clamps 1a and 1b are included to route unwanted transient energy to positive power rails and/or to ground/negative supply rails respectively. In some designs, transient clamps can be designed to route both positive and negative power rails to ground, and thus TVS clamp 1a may not be present.

In conventional approaches, on-chip transient protections 1a and 1b are designed only to protect the I/O buffer and other internal circuitry to nominal levels in order to protect them during manufacturing and assembly (e.g. 2 kV HBM ESD). These nominal levels of protection may also be sufficient for I/O pins not exposed to the external environment in the final product (such as internal memory and clock pins). However, for external interfaces (such as USB, Ethernet, and audio ports), additional TVS protection devices may be required to protect against more energetic pulses (e.g. IEC61000-4-2 Level 4, EFT, surge, etc.). In such cases, it is crucial for the system designer to select the appropriate external TVS characteristics to protect on-chip devices such that the entire system meets the overall robustness goals. Skilled persons will recognize that the information provided from component and TVS vendors may be limited or incompatible, and the analytical equipment required determining the appropriate external TVS characteristics may be cost prohibitive for a low-cost design house. Additionally, each analysis that may be needed to be performed by such analytical equipment is specific to the components related to the particular node being analyzed, and many regressions may be required against dozens of I/O types and hundreds of available devices to converge to the final estimates of appropriate external TVS characteristics. Moreover, such conventional methods suffer from inaccuracies and assumptions which may not correlate to how devices actually interact in a target system.

Figure 2:
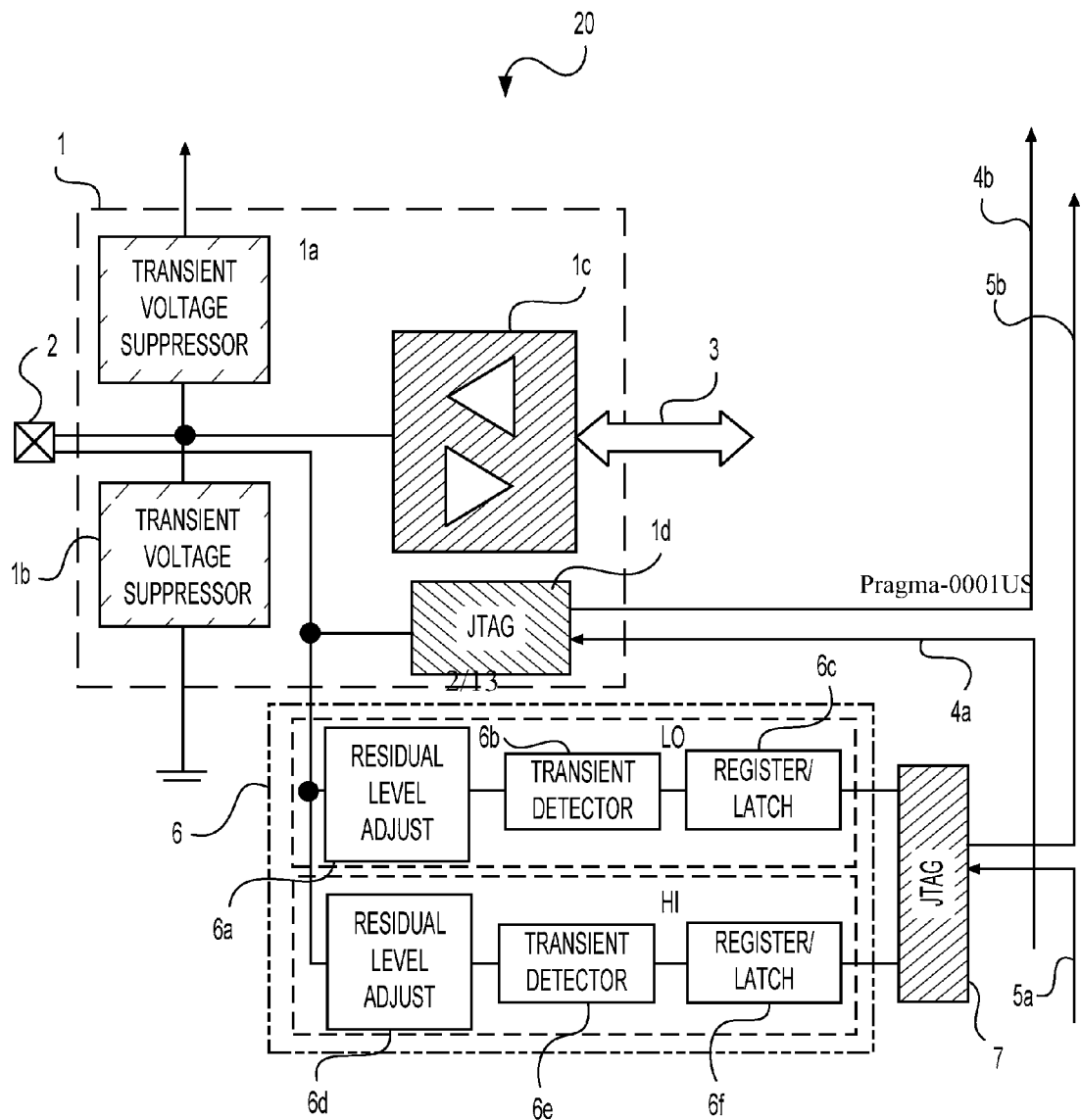
FIG. 2 shows an I/O pad cell with embedded transient detection and two-stage characterization logic blocks feeding an independent JTAG scan chain, according to exemplary embodiments.

FIG. 2 shows system 20 comprising transient event detection and characterization block 6 configured according to exemplary embodiments. Transient event detection and characterization block 6 can be coupled to conventional components such as external I/O circuit cell 1 and chip I/O connection pad 2 of FIG. 1. Within transient event detection and characterization block 6, are shown transient detectors 6b and 6e. In one illustrative example, chip I/O connection pad 2 corresponds to a node of interest for which protection from transients is desired. Accordingly, transient detectors 6b and 6e can be calibrated to detect transients on the protected and monitored node, chip I/O connection pad 2, by increasing intensity or severity of transients using residual level adjustment circuits 6a and 6d. Thereby, in some embodiments, based on the outputs of transient detectors 6b and 6e, the protected or monitored node can be identified as a node that was affected by the transient. The outputs of transient detectors 6b and 6e may be latched in register latches 6c and 6f respectively, and an indication of the identified node can be transferred or made available for status monitoring and control using boundary scan chain logic such as JTAG 7. As shown, residual level adjustment circuit 6a, transient detector 6b, and register latch 6c collectively form block "LO," depicting a low level transient detection and characterization circuit, while residual level adjustment circuit 6d, transient detector 6e, and register latch 6f collectively form block "HI," depicting a high level transient detection and characterization circuit. Accordingly in some embodiments, block LO can detect pass/fail conditions related to a first transient pulse of first severity level (low level), and store a first indication of pass/fail conditions corresponding to the first transient pulse for a corresponding node being monitored. Similarly, block HI can detect pass/fail conditions related to a second transient pulse of second severity level (high level), and store a second indication of pass/fail conditions corresponding to the second transient pulse for the corresponding node being monitored. In the illustrated embodiment of FIG. 2, conventional I/O data and boundary scan operation can be accessed through block 1d on the scan chain including input 4a and output 4b as before in FIG. 1. Additionally and independently, transient detection data and control can be accessed via the scan chain comprising JTAG 7, input 5a, and output 5b.

While the exemplary system 20 of FIG. 2 depicts two plenary data-collection buses related to JTAG 7 serial scan chains (which may be configured according to a suitable version of IEEE 1149.1/7 standard), the functionality of exemplary embodiments is not limited to nor requiring either of these instantiations of plenary data-collection buses involving input 5a and output 5b. Aggregation of transient event data can also be implemented with any other serial or parallel bus, into on-chip configuration and status registers, or to external interfaces. Any alternative bus can be used without departing from the scope of the embodiments, for example, in situations where such alternative bus is cost-effective, already being used, easily adapted in the test methodology and/or universally accepted in the industry. Exemplary embodiments comprising JTAG boundary scan generally meet the above desirable characteristics and the signaling required to route a scan chain to signals physically near I/O pads is well understood and widely accepted.

Figure 3A:
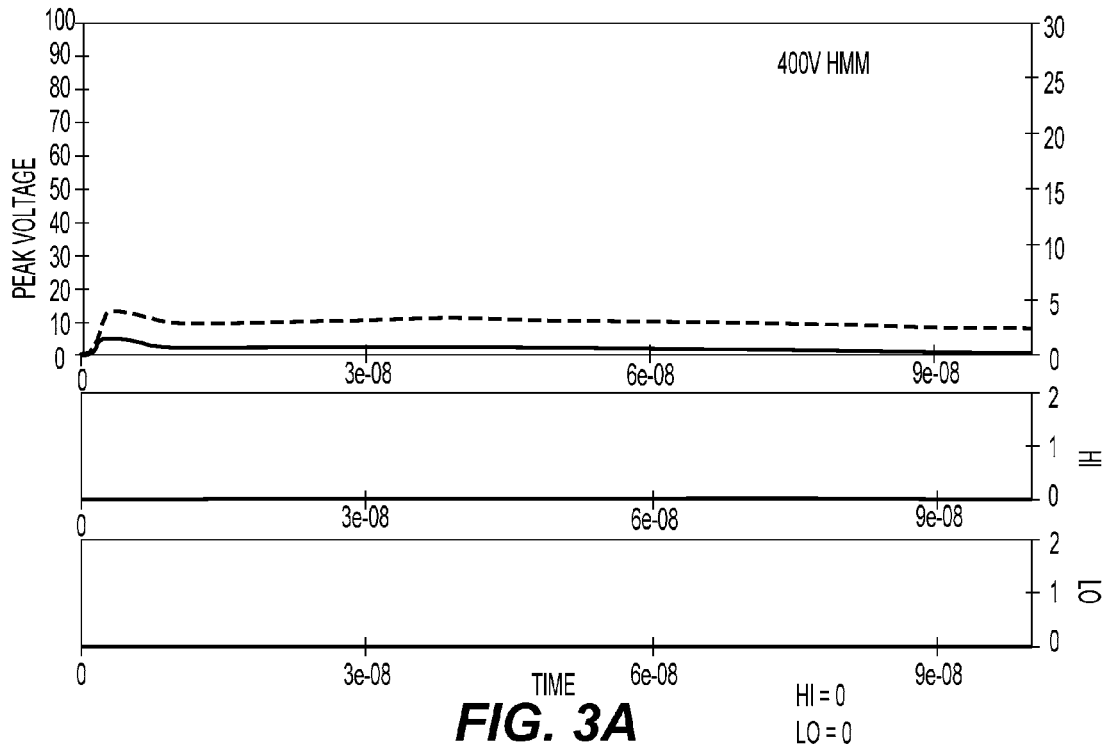
FIGS. 3A-3C show outputs of a two-stage detection and characterization unit configured according to exemplary embodiments, for three different human metal model transient input levels: 400V, 4,000V, and 8,000V respectively.
Figure 3B:
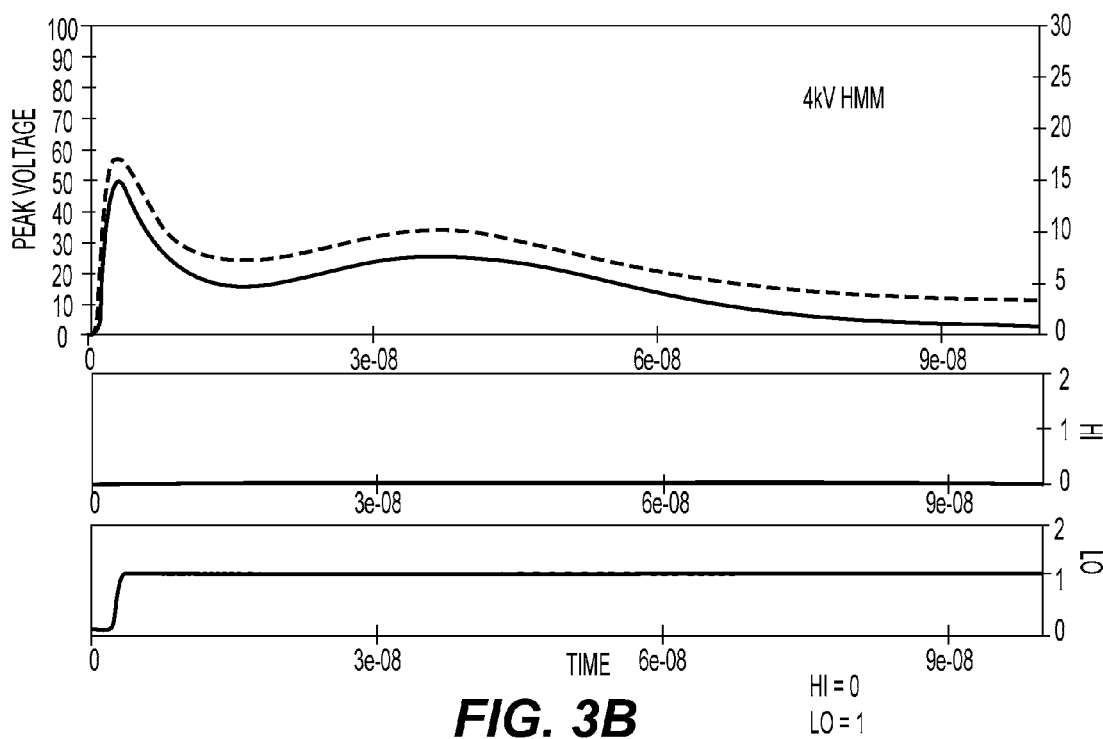
Figure 3C:
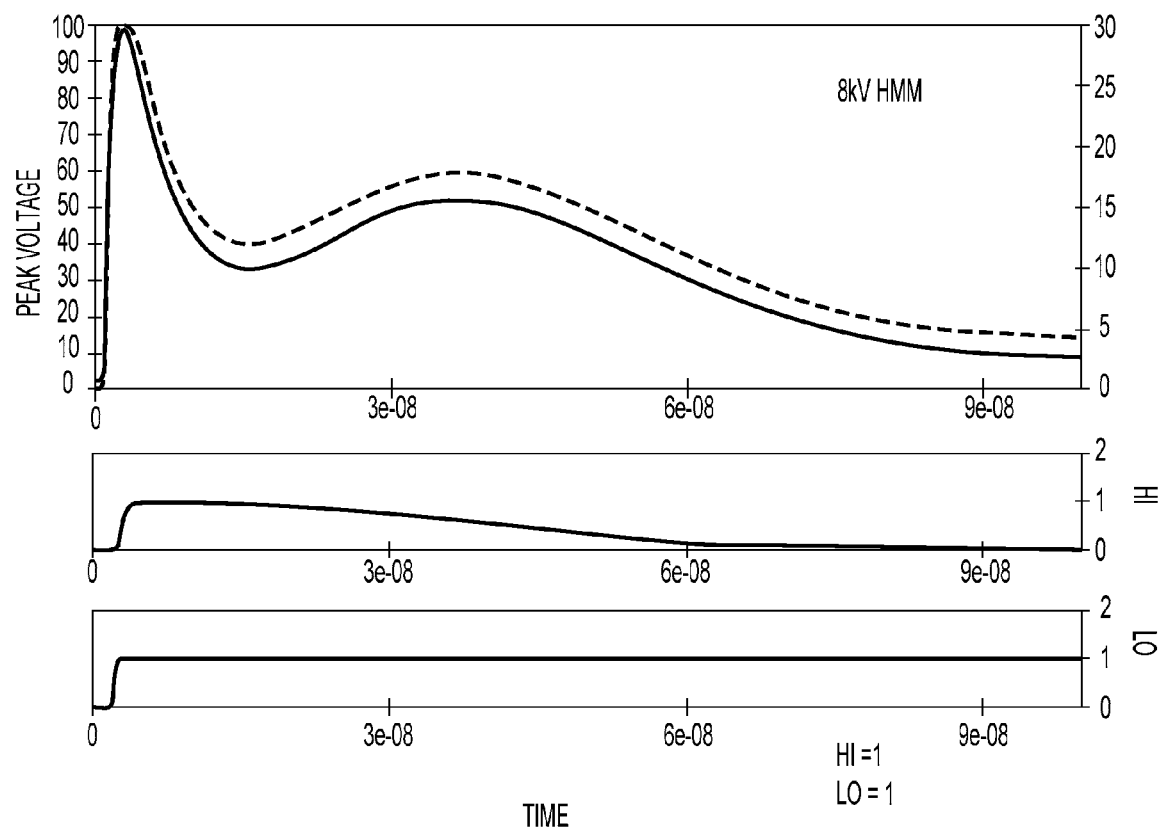

FIGS. 3A, 3B, and 3C show plots of outputs of the LO and HI blocks of system 20 of FIG. 2 for three successively more intense positive HMM pulses applied to an I/O pad cell such as chip I/O connection pad 2 coupled to the exemplary transient event detection and characterization block 6 of FIG. 2. This exemplary non-overlapping two-stage detection circuit comprising the LO and HI blocks is designed to report when the I/O pad exceeds approximately 20V, corresponding to a LO level, and also when it exceeds approximately 60V, corresponding to a HI level. The illustrated plots of FIGS. 3A-3C relate to TVS clamps 1a and 1b comprising a 7.5V zener diode with a dynamic clamping resistance of about 3 Ohms.

In FIG. 3A, a 400V HMM pulse is applied to the pin, resulting in peak currents into chip I/O connection pad 2 of less than a few Amps, and peak voltages far below 20V. The outputs of blocks HI and LO remain at logic lows. This example relates to a condition where an ESD event has occurred, but it is well within the self-protection range of chip I/O connection pad 2 and is not registered or latched into the reporting network.

In, FIG. 3B, a 4 kV HMM pulse is applied, resulting in peak currents into chip I/O connection pad 2 of about 15 Amps, and sustained voltages above 20V through the 30 ns and 60 ns periods of the HMM pulse. The output of the LO block registers this event while the output of the HI block remains at an indication of logic low. This example relates to a condition where the output of the LO block may decay beyond the illustrated timescale, and register latches 6c will retain the value of the output of the LO block until cleared or otherwise reset.

In FIG. 3C, an energetic 8 kV HMM pulse is applied, resulting in peak currents into chip I/O connection pad 2 of about 30 Amps, and sustained voltages above 60V for about 10 ns. The output of both the HI and LO blocks indicate registering this event, but the output of the HI block begins to decay after the initial pulse. This pulse length or other methods could also be characterized internally by an alternative implementation of register latch 6f of the HI block, to provide finer details or additional instrumentation of the detected event duration and intensity.

Figure 4:
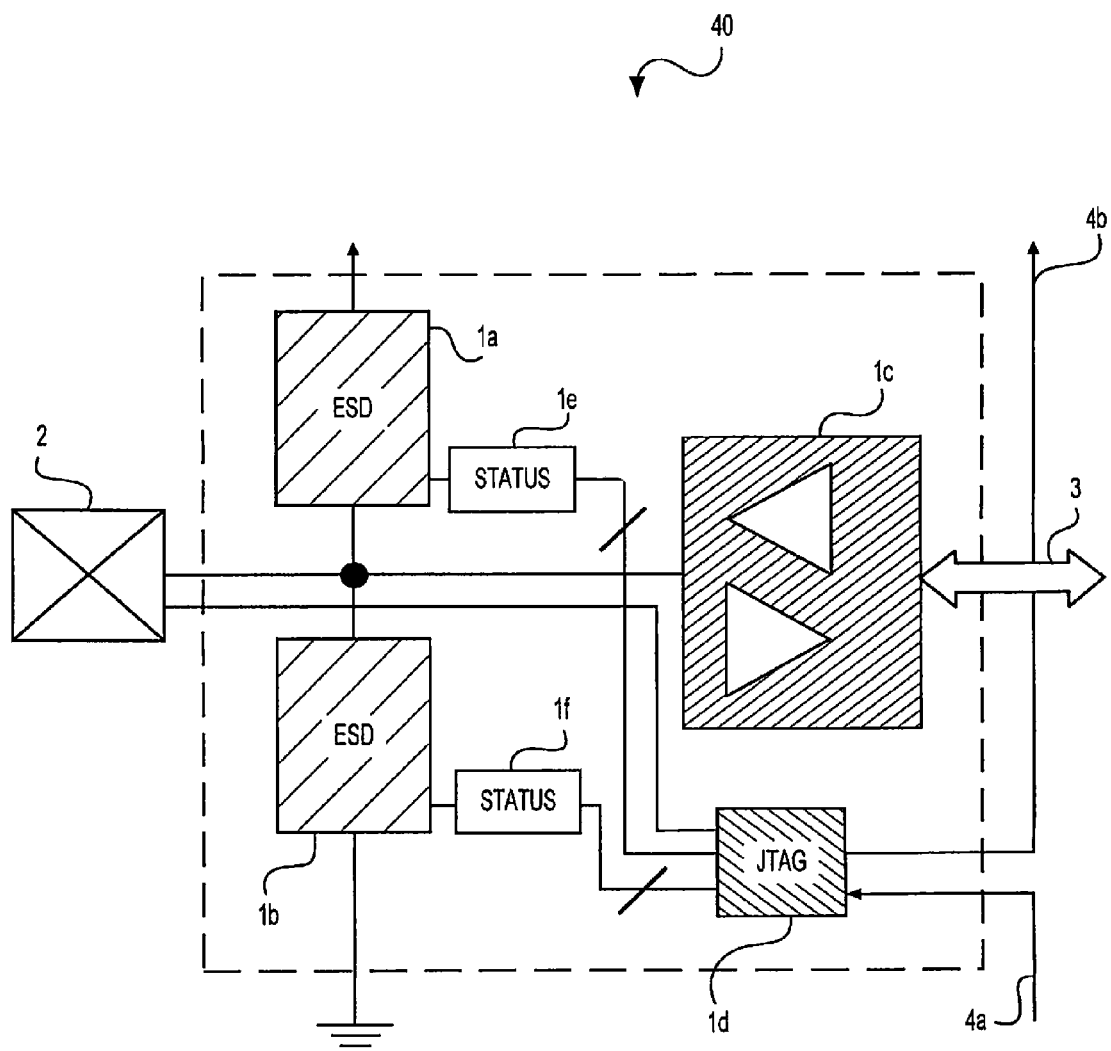
FIG. 4 shows an integration and representation of the transient detection and characterization logic inserted directly into the basic existing boundary scan test chain, according to exemplary embodiments.

FIG. 4 shows system 40 corresponding to an exemplary embodiment which extends conventional boundary scan logic such as JTAG 1d to integrate additional event detection control and status bits in an existing scan chain (e.g. input 4a and output 4b). This embodiment can be easily integrated into conventional chip architectures and design methodologies. More specifically, detectors or status blocks 1e and 1f may be introduced in system 40 as shown in FIG. 4 to capture transient event information. Accordingly, in comparison to the embodiment described with regard to FIG. 2, a scan chain comprising JTAG 7, input 5a, and output 5b can be replaced by the introduction of status blocks 1e and 1f, such that JTAG 1d may be reused for transient event detection and characterization. While in some embodiments status blocks 1e and 1f may comprise single bit registers to indicate, for example, pass/fail indications, in alternative embodiments, it is possible to configure status blocks 1e and 1f as multi-bit registers to hold additional information (e.g. LO/HI or further graduated levels of transient pulses). The resulting complexity of the interleaved scan chain in exemplary embodiments can be handled in the boundary scan description language (BSDL) description of the scan chain without adding a design cost or time penalty in the design for test (DFT) phase.

Furthermore, it is unlikely that all integrated circuit manufacturers would implement identical chain topologies for the characterization data in all products, if at all. Nor is it absolutely necessary to use a common physical plenary reporting bus as long as the results can be logically reassembled for meaningful analysis at some higher abstraction layer. It is not even necessary that there be a commonly used characterization standard among chips in the same system, nor even within the chips themselves, as long as the transient detection and characterization quantization implemented is documented and practical. This allows for a gradual introduction and adoption of exemplary embodiments into the industry.

Additionally, for TVS structures which inherently lend themselves to status instrumentation, such as triggered thyristor or FET clamps where signals can be readily adapted to monitor clamping intensity and activity, the detection and characterization functions of status blocks 1e and 1f might be integrated fortuitously into the clamps such as TVS clamps 1a and 1b. Moreover, additional detection methods, such as current sensing, and H-field/E-field monitoring can also be implemented without departing from the scope of the embodiments, while keeping in mind that potentially higher costs may be incurred. However, such higher costs may be acceptable in desired applications based on specific requirements.

Figure 5:
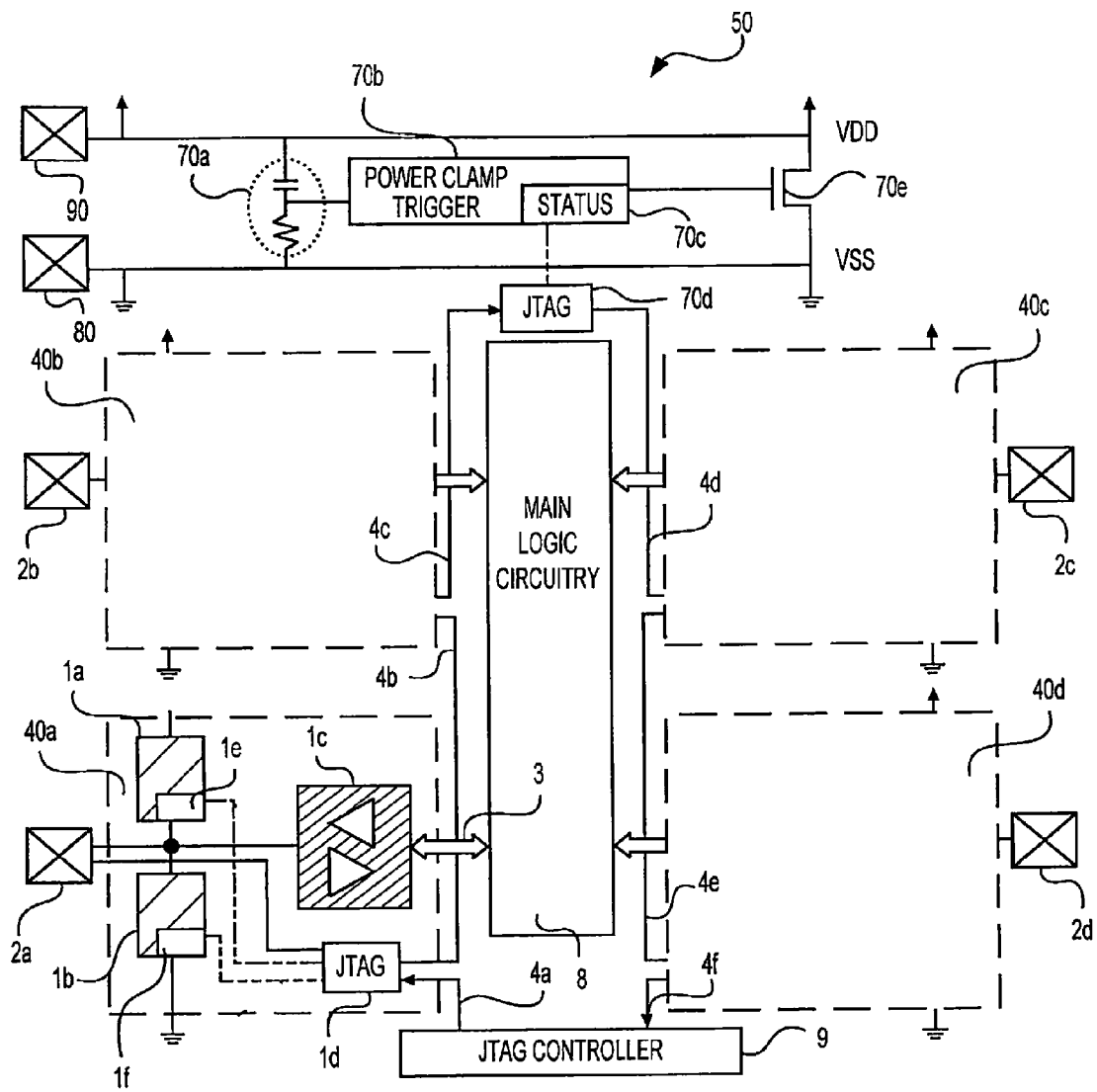
FIG. 5 shows an exemplary larger chip integrating four of the exemplary transient detection and characterization logic described in FIG. 4, along with a fifth unit which registers an internal detection and characterization unit monitoring a common internal power rail clamp. These five blocks are shown interconnected into the existing scan test chain, independent of the main core logic of the chip according to an exemplary embodiment.

FIG. 5 shows system 50 corresponding to an exemplary architecture for an integrated circuit constructed with four instantiations of a first transient event analysis circuit such as system 40 of FIG. 4 (i.e. 40a, 40b, 40c, and 40d coupled to chip I/O connection pads 2a, 2b, 2c, and 2d respectively) and one instantiation of a second transient event analysis circuit configured to monitor a power rail clamp for the entire chip power supply 90 and ground 80. FIG. 5 depicts a complete logical scan chain comprising buses 4a, 4b, 4c, 4d, 4e and 4f coupled to a common boundary scan chain logic comprising the main JTAG controller 9. Power rail clamps comprising trigger circuit 70a, power clamp trigger 70b, and active clamp 70e may be utilized to minimize transients dumped locally into VDD rail 90 and VSS rail 80. For example, positive transients may be conducted through TVS clamp 1a into the VDD rail 90. The resulting transient appearing on VDD rail 90 will be filtered through trigger circuit 70a, turning on active clamp 70e by power clamp trigger 70b to shunt any excess energy to ground 80. While the excess energy is thus split and routed around to bypass the main/logic circuitry 8 which may comprise delicate circuit elements to be protected, the transient detection and characterization logic can also effectively log the path taken around main/logic circuitry 8. In some embodiments, status block 70c may provide one or more levels or bits to characterize the intensity and duration of aggressor transient, such as the above-described positive transient.

In illustrated embodiments where status blocks such as 1e and 1f of 40a are also included (regardless of single or multiple bit/level implementations), analysis of data points comprising status blocks such as 1e and 1f of one or more of instantiations 40a, 40b, 40c, and 40d can provide information pertaining to entrance point of a transient (e.g. at chip I/O connection pads 2a, 2b, 2c and/or 2d) and also information pertaining to intensity (e.g. based on a multi-stage monitor at status block 70c of power clamp 70d) of a transient pulse appearing at any node.

A particular illustrative example pertaining to detecting entrance points and related vectors or trajectories of incident transient pulses will now be described with regard to system 50. Several nodes designated N1-Nm (not illustrated, where "m" may be any desired number) of system 50 can be monitored in a method of detecting a trajectory or entry vector of transient events incident on system 50. Nodes N1-Nm can be either internal logic nodes or storage registers of main/logic circuitry 8, or they may be I/O connection pads such as 2a-2d. The method can include subjecting system 50 to an initial transient pulse of 200V, and studying status blocks pertaining to systems 40a-40d as well as status block 70c. In one example, none of these status blocks may reveal that a transient event was registered, thus indicating that the applied transient may have been too low to register an impact on any of the nodes of system 50 that are being monitored.

Continuing with the illustrative example, the applied transient pulse can then be increased, for example, to 300V, which may affect node N1. One of the status blocks pertaining to node N1, through JTAG controller 9 may register this event, thus revealing that node N1 was affected by a 300V pulse. Additionally, status block 70c may also get updated to reflect that system 50 received a transient pulse which affected one of the nodes of the system.

The applied transient pulse level can then be further increased to 400V, and this time, nodes N1-N4 may be detected as being affected, in a similar manner as described above. In an additional step, the applied transient pulse level can be further increased to 500V, and correspondingly, nodes N1-N5 may be detected as being affected. At this point in the method, it can be determined that node N1 is damaged, and the entry vector or trajectory comprises nodes N1-N5 for an applied 500V pulse. Moreover, it can be determined that the minimum pulse level which affects system 50 is 300V. Accordingly, the method can be continued until a maximum pulse level, beyond which system 50 may be irreversibly damaged. Variations of such an illustrative method will be recognized by skilled persons, and can be applied to particular systems or characterization processes for transient events, based on particular applications or needs. Each node may be characterized based on the pulse levels at which permanent damage may occur for the node. Moreover, once such information is available, targeted protection, for example, in the form of TVSs can be provided for particular nodes which are detected to be susceptible, in order to alleviate the problems which may arise due to their susceptibility in the field or in test/production environments. Accordingly, design, placement, and configuration of the TVSs can be based on the entry point or vectors determined from identifying the nodes N1-Nm which are affected by the applied pulses.

Figure 6:
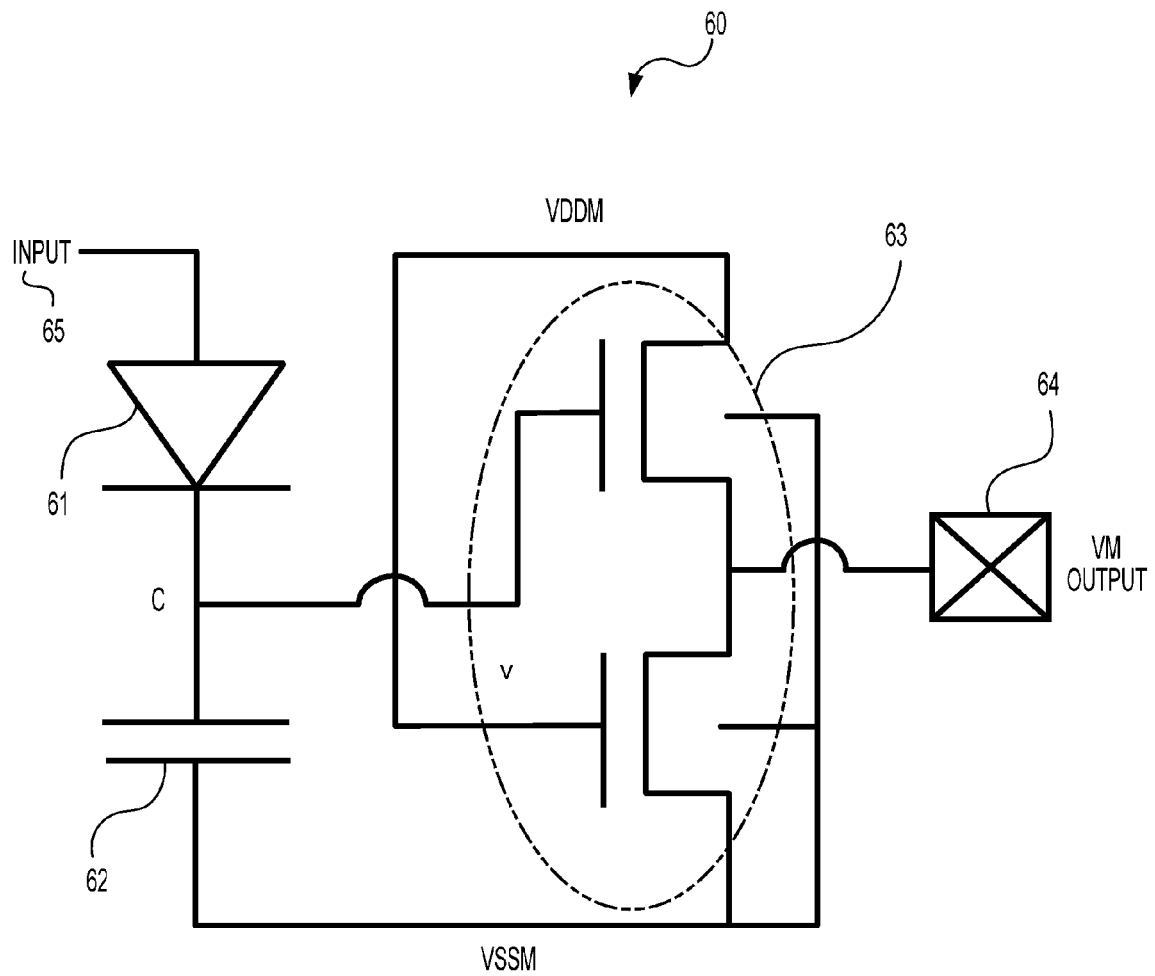
FIG. 6 shows a conventional state-of-the-art CDM ESD detector which can be incorporated into exemplary embodiments for event detection and characterization.

FIG. 6 illustrates a conventional CDM voltage detector 60, configured for example, according to the voltage monitor circuit disclosed in "Jack and Rosenbaum, Voltage Monitor Circuit for ESD Diagnosis, EOS/ESD Symposium 2011, Anaheim, Calif., pages 369-377" and incorporated by reference herein. As illustrated in FIG. 6, CDM voltage detector 60 includes a persistent non-volatile indicator which provides transient detection functionality even when power is not applied to the system. Accordingly, in some embodiments, transient detectors 6b and/or 6e of system 20 of FIG. 2 may be configured to comprise CDM voltage detector 60. In CDM voltage detector 60, when a positive aggressor pulse is applied to input 65, forward biased diode 61 charges storage capacitor 62. High input impedance source-follower 63 buffers the voltage of storage capacitor 62 to output 64 when VDDM is applied. This provides a time window of several minutes after a strike during unpowered testing for an associated system/DUT or only a boundary scan subsystem to be powered up and allow persistent status information to be read out of CDM voltage detector 60.

The utility of powered and unpowered testing in a development lab may also be used in an end user environment for system recovery. If a watchdog timer periodically polls a system/DUT or is interrupted by an event detection, the system/DUT can log and respond to transient events even when it is not in a powered state, by utilizing components such as CDM voltage detector 60 described above.

Figure 7:
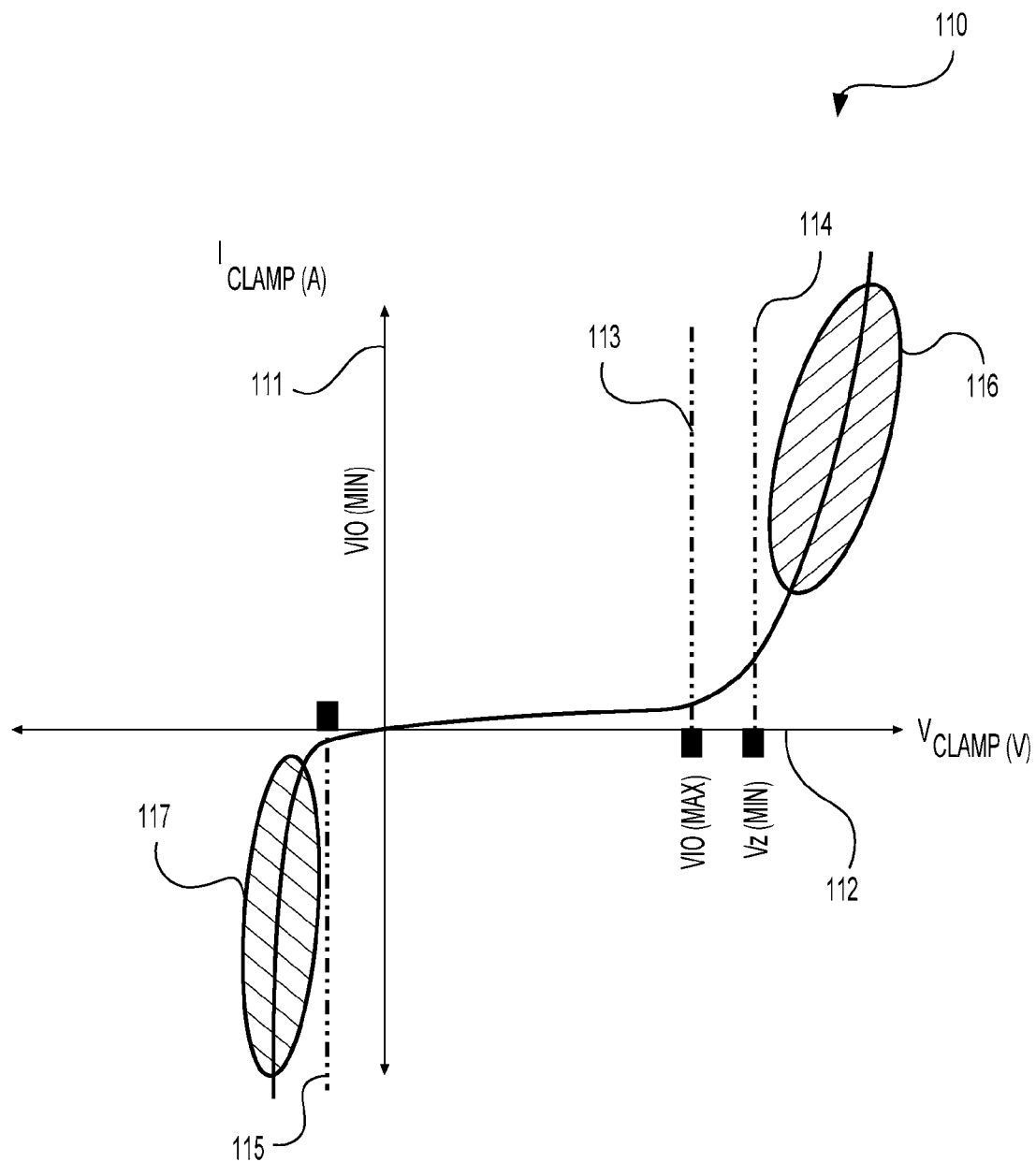
FIG. 7 shows positive and negative "detection regions" of interest in the current vs. voltage map for a conventional TVS protection circuit constructed with a conventional zener diode clamp.

FIG. 7 shows I-V curve 110 of a TVS clamp such as TVS clamp 1b of FIG. 2, implemented with a conventional zener diode in an exemplary embodiment. Along X-axis 112 is illustrated transient voltages (Vclamp) appearing across the zener diode, and along Y-axis 111 is illustrated the current (Iclamp) passing through the zener diode. The illustrated embodiment of FIG. 7 shows two detection regions of interest that a designer may choose to target in exemplary embodiments. During a negative transient strike relative to ground, a detector such as transient detector 6b/6e may be required to respond to peak voltages in negative clamping region 117 below forward biased voltage 115 of the zener diode. During a positive transient strike relative to ground, transient detector 6b/6e may be required to respond to peak voltages in positive clamping region 116 above the breakdown voltage 114 of the zener diode. As shown, voltage VIO (MAX) 113 depicts a predetermined maximum excursion that may be allowed for normal I/O voltage levels for normal operation on a node to which the zener diode is coupled to for protection from transient events. Also shown is Vz (MIN) 114, which pertains to the lowest voltage at which the protection from transient events will be triggered by commencement of the clamping by the zener diode. Accordingly, it is desirable to design the zener diode such that Vz (MIN) 114 is higher than VIO (MAX) 113.

Figure 8:
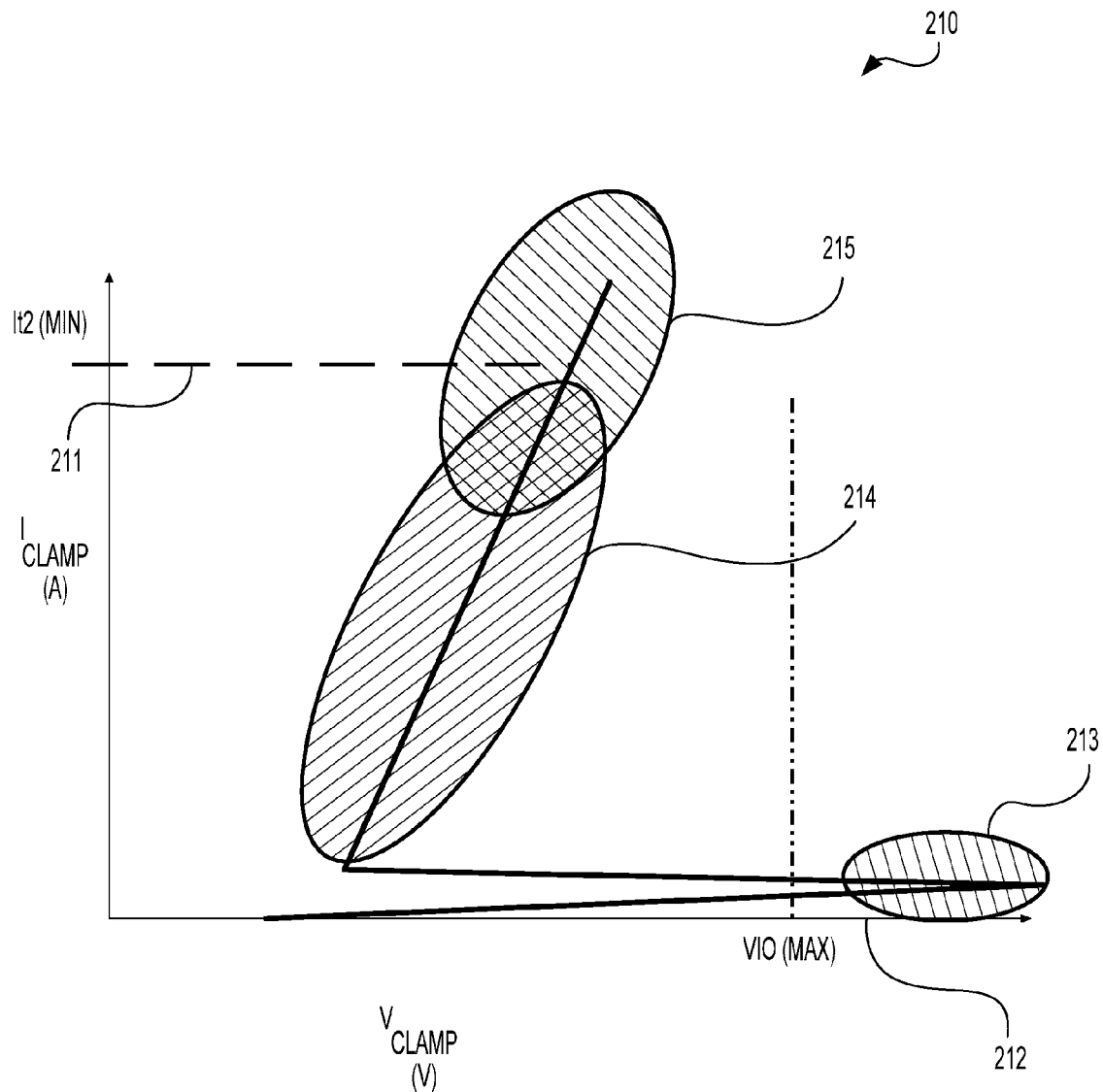
FIG. 8 shows a three-stage detection and characterization region in the positive clamping quadrant of a protection device with a snapback characteristic, configured according to exemplary embodiments, and where the characterization stages may overlap.

FIG. 8 shows I-V curve 210 of a clamp such as TVS clamp 1b of FIG. 2, which exhibits snapback characteristics. Along X-axis 212 is illustrated transient voltages (Vclamp) appearing across the clamp, and along Y-axis 211 is illustrated the current (Iclamp) passing through the clamp. With a clamp which displays snapback characteristics as shown, there may be several opportunities to characterize severity of an incident transient pulse applied to the clamp, based on inherent characteristics of the clamp. When the incident transient pulse exceeds the absolute maximum rating of the I/O pad such as chip I/O connection pad 2, but still has not reached the trigger voltage of the clamp, relating to region 213, then it can be concluded that the clamp is not substantially conducting current, but that the I/O pad may be seeing a relatively high voltage peak. This can provide a warning track for a system designer that the lowest threshold of robustness is being approached at the given incident transient pulse severity. Intermediate region 214 in this implementation overlaps potential damage region 215. These two overlapped regions can provide an overall three-stage transient characterization in addition to the first stage corresponding to region 213 with a borderline zone where permanent damage may be about to occur before potential damage (e.g. "It2" damage) in either regions 214 or 215. Persons skilled in the art will recognize that "It1" and "Vt1" refer to turn-on current and voltage values of a device such as a typical parasitic n-channel metal oxide semiconductor (NMOS) device, and correspondingly, "It2" and "Vt2" relate to the current/voltage values at which onset of permanent damage occurs for the device. Accordingly, it is desirable that It1 and Vt1 are greater than normal operating current/voltage values, and It2 and Vt2 are greater than current/voltage values relating to absolute transient protection ratings of the device (i.e. the maximum transient pulse value that the device can withstand without damage).

Figure 9:
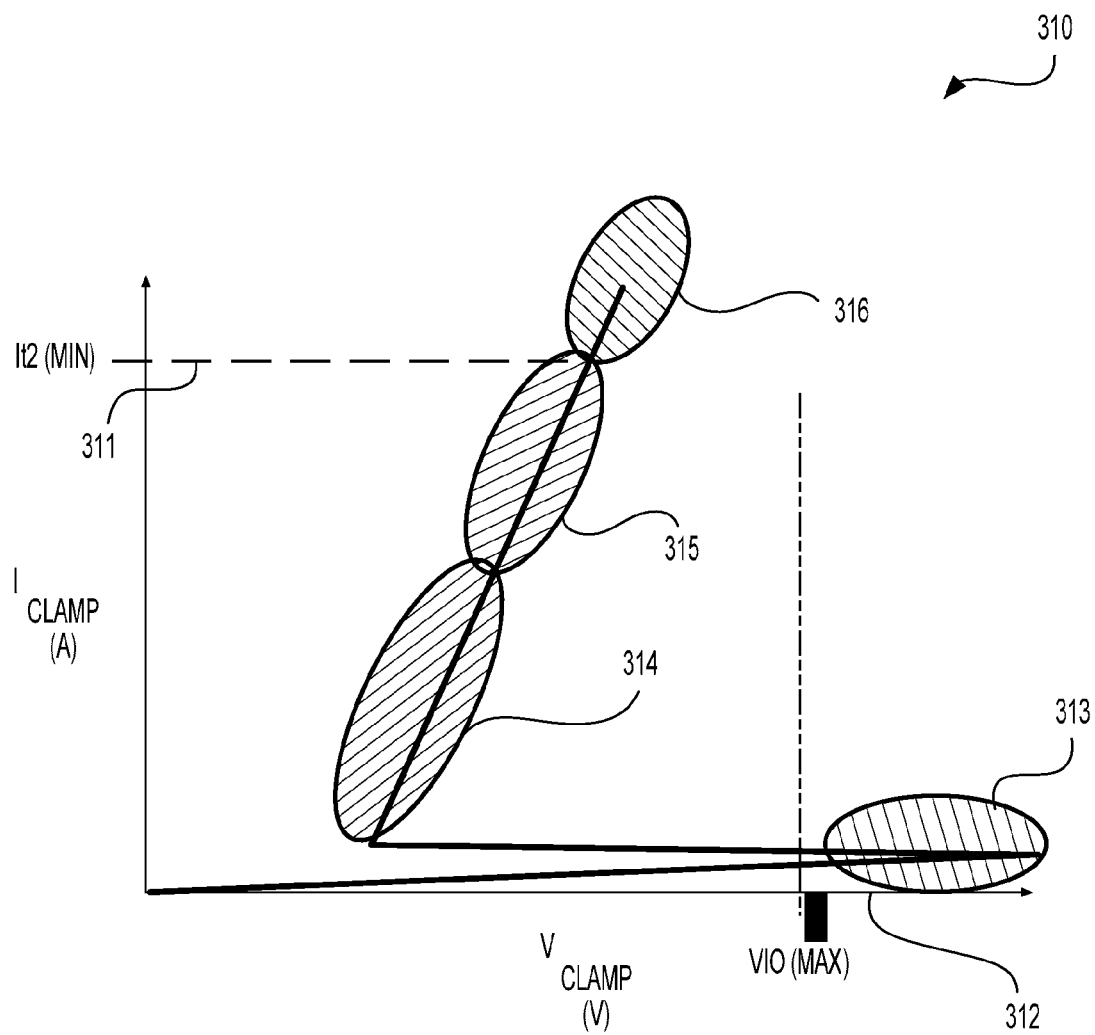
FIG. 9 shows an example of a four-stage detection and characterization region in the positive clamping quadrant of a protection device with a snapback characteristic, configured according to exemplary embodiments, and where the characterization stages do not overlap.

FIG. 9 shows I-V curve 310 of another clamp such as TVS clamp 1b of FIG. 2, which exhibits snapback characteristics over four contiguous non-overlapping characterization regions (313, 314, 315 and 316). As above, along X-axis 312 is illustrated transient voltages (Vclamp) appearing across the clamp, and along Y-axis 311 is illustrated the current (Iclamp) passing through the clamp. The non-overlapping characterization regions are shown here only in the I-V domain of the clamp. It some cases, it may also be desirable to characterize the transient pulse width, total energy, thermal rise time, total number of pulses, etc. While more data-collection is often desirable during debug, excessive characterization granularity may also be incrementally cost prohibitive and some cases, even redundant or functionally problematic.

It will be understood that while exemplary embodiments can be universally implemented in any integrated circuit or system, and that the detection method, scope, characterization stages and scan chain or plenary reporting interface need not be consistent among different chips, subsystems, or even within single integrated circuits in order to effectively aggregate the abstracted characterization dataset.

Figure 10:
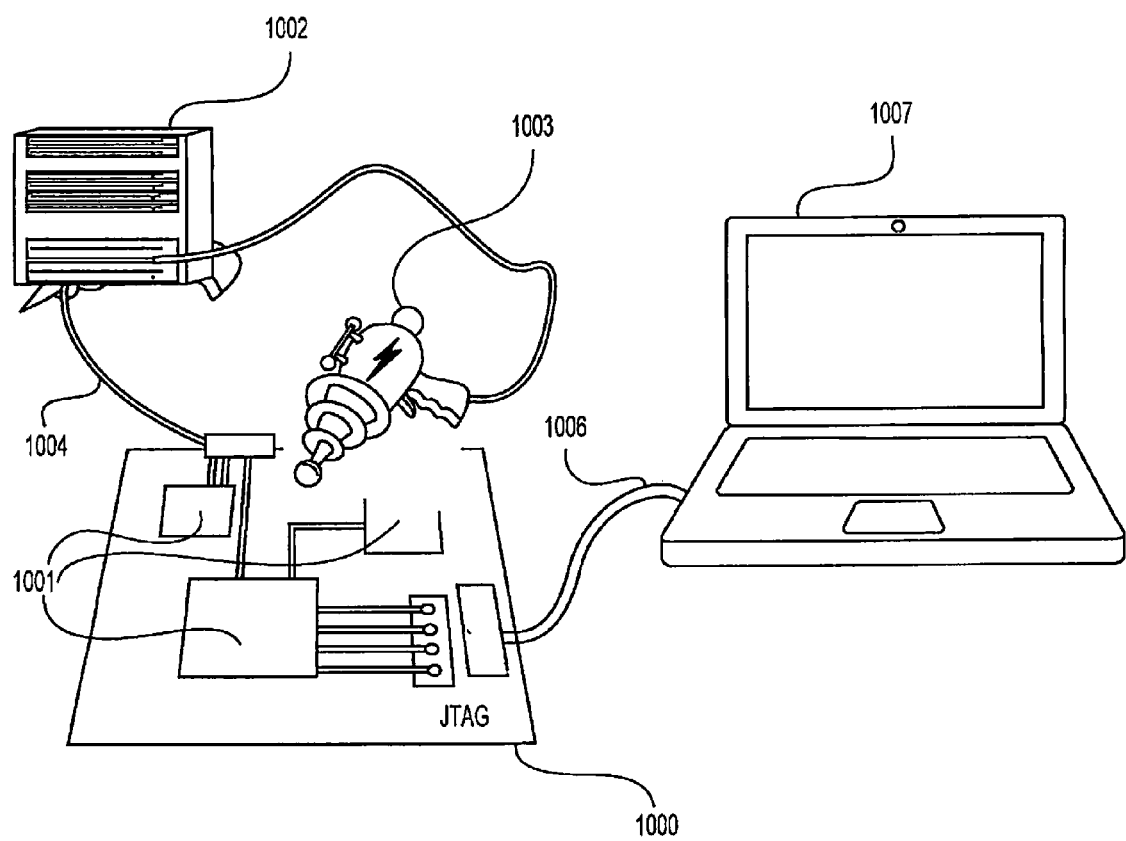
FIG. 10 shows a conventional ESD/EOS system level testbench for analyzing system level robustness.

FIG. 10 shows an exemplary transient evaluation workstation with the working sub-assembly board for DUT 1000, connected to transient simulators 1002 and/or 1003, which may be ESD simulators, with ground return cable 1004. It will be recognized that transient simulators 1002/1003, ground return cable 1004, etc. may already be present and available in EMC qualification labs and acceptance centers.

Accordingly, once the circuitry related components 1001 on DUT 1000 are invested in, the only additional components that may be required for exemplary embodiments may be a plenary network communication interface, such as JTAG interface cable 1006 and a controller PC or functional/ICT tester 1007 running appropriate software to read, process, and display event detection information.

Beginning from a known state of functionality, a typical iterative step test may be run, starting by applying a low level non-destructive transient pulse to a system such as DUT 1000 as appropriate via 1003, verifying functionality and reading characterization data periodically between steps. By successively increasing the levels of the transient pulse the susceptibility and robustness can be characterized system-wide. Skilled persons will recognize alternative analytical procedures that can be developed from the disclosed embodiments for A-to-B comparisons of different components within a same system board and such other applications.

Figure 11:
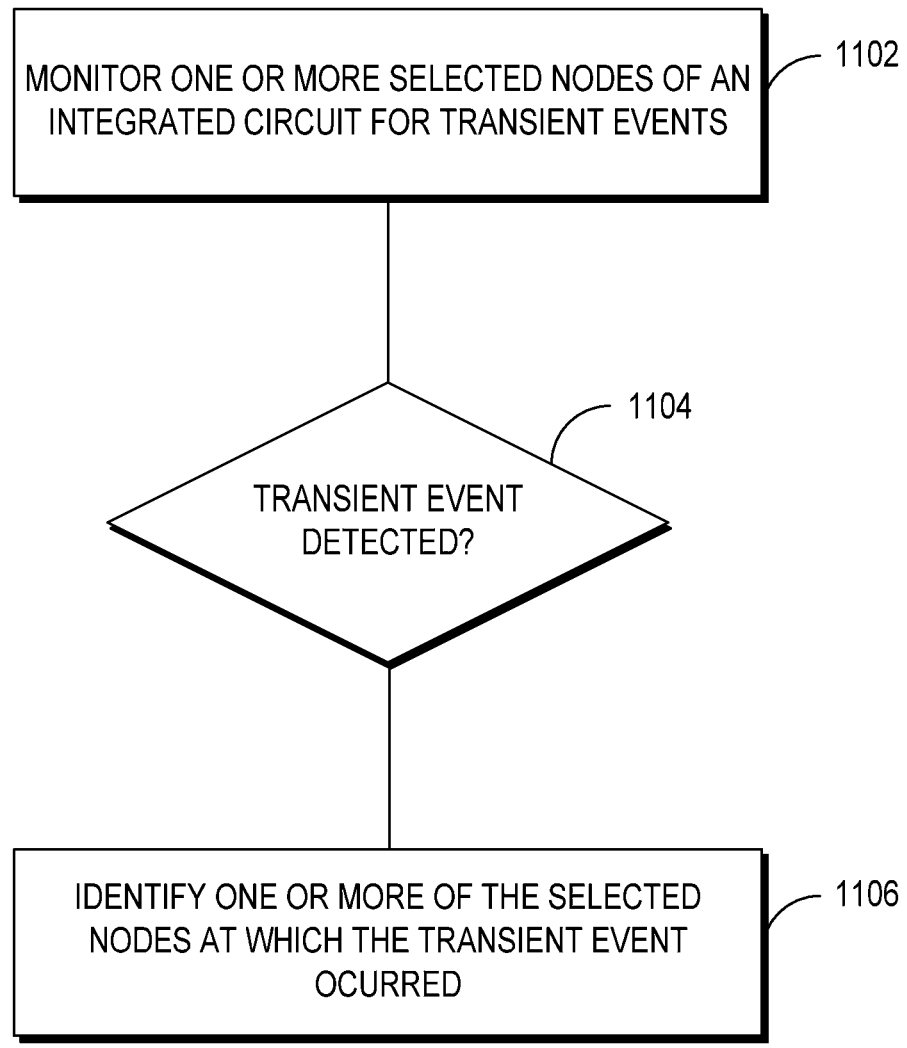
FIG. 11 illustrates a method of monitoring an integrated circuit for transient events according to an exemplary embodiment.

It will be appreciated that embodiments include various methods for performing the processes, functions and/or algorithms disclosed herein. For example, as illustrated in FIG. 11, an embodiment can include a method of analyzing a transient event in an integrated circuit (e.g. system 50), the method comprising: monitoring one or more selected nodes (e.g. chip I/O connection pad 2 or node or monitored by JTAG 7, input 5a, and output 5b in FIG. 2 or an internal node of main logic/circuitry monitored by status blocks 1e, 1f, JTAG 1d, input 4a, output 4b or block 40a of FIG. 5) of the integrated circuit for transient events—Block 1102; detecting that a transient event has occurred in the integrated circuit—Block 1104; and identifying one or more of the selected nodes at which the transient event occurred—Block 1106.

Figure 12:
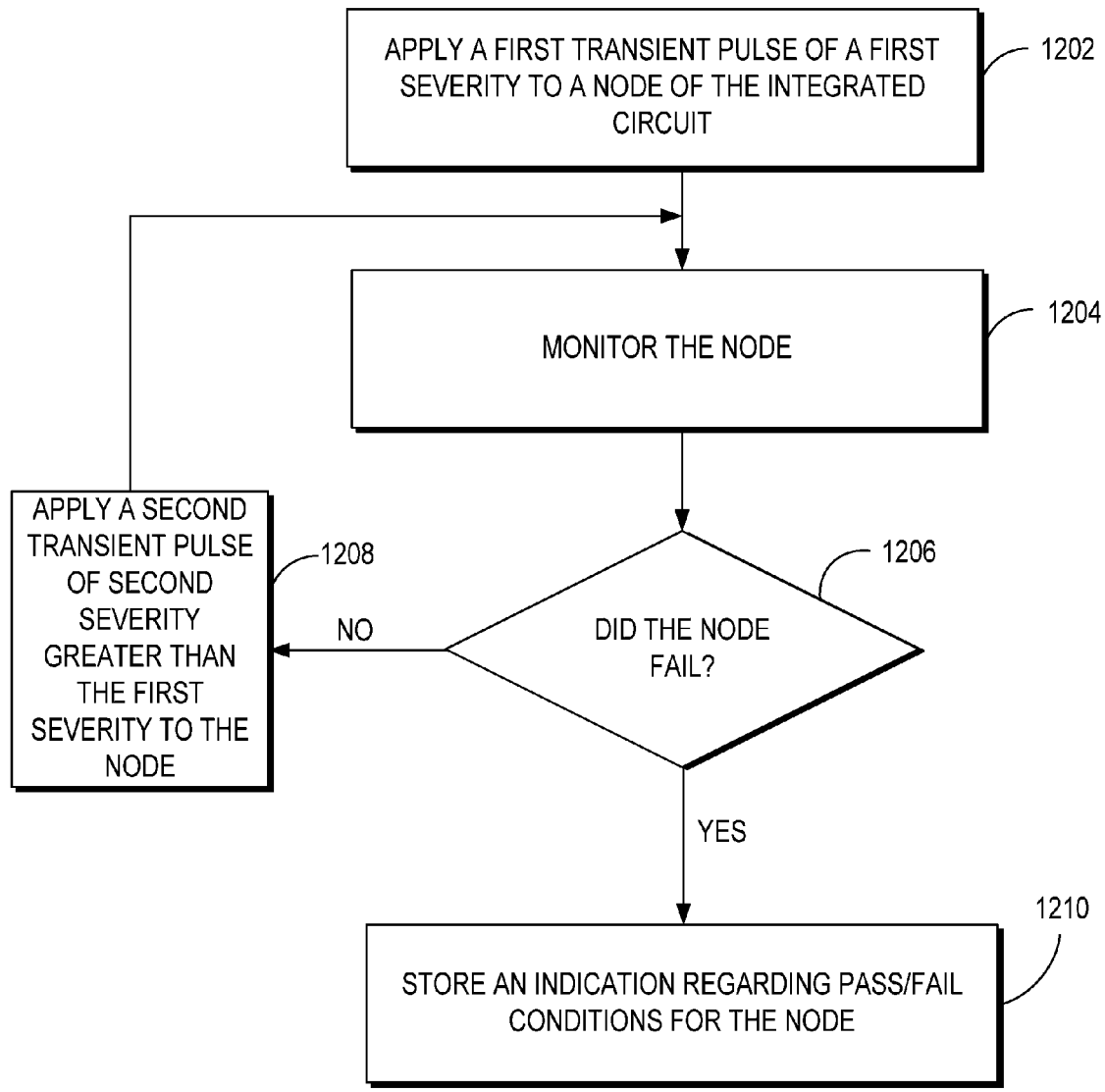
FIG. 12 illustrates a method of characterizing a node of an integrated circuit based on incident transient pulses, according to an exemplary embodiment.

In another example, as illustrated in FIG. 12, an embodiment can include a method of characterizing an integrated circuit for transient events, the method comprising: applying a first transient pulse of a first severity to a node of the integrated circuit—Block 1202; monitoring the node—Block 1204; detecting whether the node failed—decision Block 1206; and storing a first indication of the pass/fail conditions corresponding to the first transient pulse for the node—Block 1210. In some embodiments, the method can further include, branching from decision Block 1206 if the node did not fail, to applying a second transient pulse of a second severity greater than the first severity to the node—Block 1208; and repeating to the process, starting from monitoring the node at Block 1204. The process may be repeated by increasing the value of the transient pulse until the node fails (in some embodiments, a predetermined maximum limit may be set, to which transient pulse levels can be increased, in order to prevent permanent damage from occurring due to the characterization process). In this manner, selected nodes can be characterized and rated according to their capabilities for withstanding transient pulses. In some embodiments, nodes which are determined to be highly susceptible from the above process, can be provided with additional protection, for example, in the form of TVS clamps.

While the present invention has been described above in terms of specific embodiments, it is to be understood that the invention is not limited to these disclosed embodiments. Upon reading the teachings of this disclosure many modifications and other embodiments of the invention will come to mind of those skilled in the art to which this invention pertains, and which are intended to be and are covered by both this disclosure and the appended claims. It is indeed intended that the scope of the invention should be determined by proper interpretation and construction of the appended claims and their legal equivalents, as understood by those of skill in the art relying upon the disclosure in this specification and the attached drawings.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for detecting and characterizing transient events in an integrated circuit. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method of monitoring and/or characterizing an integrated circuit and/or system for transient events and/or effects thereof, the integrated circuit and/or system having one or more transient event detectors that are associated with one or more nodes, the method comprising:
   determining an intensity level and an entry vector of a transient event using the one or more transient event detectors; and/or
   determining an effect of a transient event by analyzing failure criteria and the transient event's intensity level and entry vector.

2. The method of claim 1, wherein the method includes:
   identifying one or more nodes that are affected by a transient event;
   determining an entry vector of the transient event based on the identified one or more nodes; and
   analyzing pass/fail criteria for the identified one or more nodes to determine an effect of the transient event.

3. The method of claim 1, wherein the method includes:
   storing one or more transient event characteristics for the one or more nodes, the one or more transient event characteristics for a node include the indication of whether a transient event was incident at the node and the intensity level and the entry vector of the transient event; and
   determining the effect of the transient event based on the stored one or more transient event characteristics.

4. The method of claim 1, wherein the method includes:
   comparing an intensity level of a transient event to two or more defined threshold levels of intensity; and determining the intensity level of the transient event based on the comparison; and/or
   comparing an effect of a transient event to characterizations of effects and/or failure criteria; and determining the intensity level of the transient event based on the comparison.

5. The method of claim 1, further comprising placing the one or more transient event detectors in the integrated circuit and/or system such that the one or more transient event detectors are associated with one or more predetermined nodes of the integrated circuit and/or system and configured to detect whether a transient event was incident on an associated node.

6. The method of claim 1, wherein:
   the method further comprises transferring transient event characteristics of the one or more nodes to a storage medium or a display device; and/or
   the one or more transient event detectors are coupled to the associated one or more nodes through a boundary scan chain logic that is an existing joint test access group (JTAG) scan chain in the integrated circuit and/or system.

7. The method of claim 1, further comprising:
   detecting a severity of a transient event, wherein the severity of the transient event corresponds to one or more of a voltage level, duration, rise time, energy level, peak current, or average current of the transient event; and/or
   protecting the integrated circuit and/or system from the effects of the transient event by shielding and/or by rejecting or diverting a related transient pulse into one of ground or supply voltage rails using one or more transient voltage suppressor (TVS) elements.

8. The method of claim 1, further comprising coupling storage logic to one or more transient voltage suppressor (TVS) elements, the storage logic configured to store an indication of transient events.

9. The method of claim 1 performed in a transient event analysis circuit embedded in the integrated circuit and/or system, wherein:
   the one or more nodes comprise one or more of an internal node, a net, a status register, a storage register, a logic element, an input/output node, a power pin, or a pad of the integrated circuit and/or system; and/or
   the transient event is one of an electrostatic discharge (ESD), machine model (MM), charged device model (CDM), human body model (HBM), human metal model (HMM), electrical fast transient (EFT), transmission line pulse (TLP), radio frequency (RF) field effect, voltage glitch, lightning, surge pulse, or single event related upset (SEU); and/or
   the integrated circuit and/or system comprises a device under test (DUT), a test chip, one or more chips of a system, or a system on a chip (SoC).

10. The method of claim 1, wherein:
    the transient event is an unknown externally applied pulse; and
    the method includes characterizing the externally applied pulse by determining an intensity level and an entry vector of the unknown externally applied pulse using the one or more transient event detectors of the integrated circuit and/or system.

11. The method of claim 1, wherein the method includes either:
    determining an intensity level and an entry vector of a transient event using the one or more transient event detectors of the integrated circuit and/or system; or
    determining an effect of a transient event by analyzing failure criteria and the transient event's intensity level and entry vector.

12. The method of claim 1, wherein the method includes:
    determining an intensity level and an entry vector of a transient event using the one or more transient event detectors of the integrated circuit and/or system; and
    determining an effect of a transient event by analyzing failure criteria and the transient event's intensity level and entry vector.

13. The method of claim 1, further comprising mitigating an effect of a transient event based on the transient event's entry point or entry vector.

14. The method of claim 13, wherein mitigating comprises:
    applying pulses having successively increased intensity to the integrated system; and
    analyzing transient event data between pulses to compare and contrast transient mitigation options and/or characterize protection robustness margin and failure levels.

15. The method of claim 13, wherein mitigating comprises optimally using one or more transient voltage suppressor (TVS) elements and/or shielding.

16. The method of claim 1, wherein the method includes:
    storing one or more transient event characteristics for the one or more nodes, the one or more transient event characteristics for a node comprising an indication of whether a transient event was incident at the node and the intensity level and the entry vector of the transient event; and determining effects of transient events based on comparisons of one or more transient event characteristics for the one or more nodes.

17. The method of claim 16, further comprising mitigating the effects of the transient events based on comparisons of intensity levels for entry points or entry vectors of the transient events.

18. The method of claim 17, wherein mitigating comprises optimally using one or more transient voltage suppressor (TVS) elements and/or shielding.

19. The method of claim 1, further comprising:
applying a transient pulse of known intensity level to the integrated system; and
if the one or more transient event detectors detect a transient event generated by the applied transient pulse, determining an effect of the transient event generated by the applied transient pulse.

20. The method of 19, further comprising:
determining whether the integrated circuit and/or system failed as a result of the transient event generated by the applied transient pulse; and
characterizing the integrated circuit and/or system based on the known intensity of the applied pulse which caused failure.

21. The method of claim 19, further comprising characterizing the applied transient pulse based on the determined effect of the transient event generated by the applied transient pulse, wherein characterizing the applied transient pulse comprises associating the known intensity level of the applied transient pulse to the one or more nodes where the transient event generated by the applied transient pulse was detected.

22. The method of claim 21, further comprising determining whether any of the one or more nodes failed, wherein characterizing the applied transient pulse further comprises associating the known intensity level of the applied transient pulse to nodes which failed as a result of the transient event generated by the applied transient pulse.

23. A method of monitoring and/or characterizing an integrated circuit and/or system for transient events and/or effects thereof, the integrated circuit and/or system having one or more transient event detectors that are associated with one or more nodes, the method comprising:
applying a transient pulse of known intensity level to the integrated system; and
characterizing an effect of the applied transient pulse by associating the known intensity level of the applied transient pulse to the one or more nodes where the applied transient pulse was detected.

24. The method of claim 23, further comprising determining whether any of the one or more nodes failed, and wherein characterizing an effect of the applied transient pulse comprises associating the known intensity level of the applied transient pulse to the one or more nodes that failed as a result of the applied transient pulse.

25. The method of claim 23, further comprising:
determining whether the integrated system failed as a result of the applied transient pulse; and
characterizing the integrated system based on the known intensity level of the applied pulse which caused failure, including characterizing the protection performance at the known intensity level.

26. The method of claim 23, wherein applying a transient pulse of known intensity level to the integrated system comprises applying a first transient pulse of a first severity to a node, and applying a second transient pulse of a second severity different than the first severity to the node; and wherein the method comprises detecting pass/fail conditions related to the node for the first and second transient pulses, and characterizing the node based on the pass/fail conditions related to the node for the first and second transient pulses.

27. A system comprising:
one or more transient event detectors associated with one or more nodes and configured to detect whether a transient event was incident on an associated node;
one or more intensity detection circuits configured to determine an intensity level of a transient event if the transient event is detected by a transient event detector for an associated node;
one or more status storage blocks configured to store transient event characteristics for the one or more nodes, including an indication of whether a transient event was incident at a node and the corresponding intensity level of the transient event; and
a monitoring circuit configured to determine the effect of transient events based on the stored transient event characteristics for the one or more nodes.

28. The system of claim 27, wherein:
the monitoring circuit further comprises logic configured to help determine entry points or entry vectors of transient events based on the stored transient event characteristics for the one or more nodes; and/or
the monitoring circuit comprises one or more positive power supply voltage rails and one or more negative power supply voltage rails, the monitoring circuit is configured to divert a transient pulse related to the transient event into at least one positive power supply voltage rail or negative power supply voltage rail, and the monitoring circuit further comprises a power clamp trigger circuit configured to store an indication based on the diversion of the transient pulse.

29. The system of claim 27 comprising a device under test (DUT), a test chip, one or more chips of a system, or a system on a chip (SoC), and/or wherein:
the one or more transient event detectors are coupled to the associated one or more predetermined nodes through a boundary scan chain; and/or
the one or more nodes comprise one or more of an internal node, a net, a status register, a storage register, a logic element, an input/output node, a power pin, or a pad of an integrated circuit; and/or
the transient event characteristics further comprise one or more of a voltage level, duration, rise time, energy level, peak current, or average current of the transient event.

30. A system for determining effects of transient events incident on an integrated circuit having one or more transient event detectors in the integrated circuit that are associated with one or more nodes of the integrated circuit, the system comprising:
means for determining an intensity level and an entry vector of a transient event if detected by a transient event detector for an associated node;
means for storing transient event characteristics for the one or more nodes, the transient event characteristics for a node comprising an indication of whether a transient event was incident at the node and the intensity level and entry vector of the transient event; and
means for determining the effect of transient events based on the stored transient event characteristics for the one or more nodes.

31. A non-transitory computer-readable storage medium comprising code, which, when executed by a processor, causes the processor to perform operations for determining effects of transient events incident on an integrated circuit and/or system having one or more transient event detectors that are associated with one or more nodes, the operations performed by the processor when executing the code including:
   determining an intensity level and an entry vector of a transient event if detected by a transient event detector for an associated node;
   storing transient event characteristics for the one or more nodes, the transient event characteristics for a node comprising an indication of whether a transient event was incident at the node and the intensity level and the entry vector of the transient event; and
   determining the effect of transient events based on the stored transient event characteristics for the one or more nodes.

* * * * *